United States Patent
Shih et al.

(10) Patent No.: US 6,624,685 B2
(45) Date of Patent: Sep. 23, 2003

(54) LEVEL DETECTION BY VOLTAGE ADDITION/SUBTRACTION

(75) Inventors: Albert Shih, Dallas, TX (US); Jeffrey E. Koelling, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 18 days.

(21) Appl. No.: 09/798,172

(22) Filed: Mar. 2, 2001

(65) Prior Publication Data

US 2001/0007429 A1 Jul. 12, 2001

Related U.S. Application Data

(62) Division of application No. 09/383,696, filed on Aug. 26, 1999.
(60) Provisional application No. 60/098,671, filed on Sep. 1, 1998.

(51) Int. Cl.[7] .............................. G05F 1/10; G05F 3/02
(52) U.S. Cl. ..................................................... 327/541
(58) Field of Search .............................. 327/63, 65, 74, 327/538, 540, 541, 543; 323/281, 313

(56) References Cited

U.S. PATENT DOCUMENTS

| | | | | |
|---|---|---|---|---|
| 4,716,307 A | * | 12/1987 | Aoyama | 327/543 |
| 5,045,806 A | * | 9/1991 | Yan | 330/252 |
| 5,061,862 A | | 10/1991 | Tamagawa | 325/541 |
| 5,253,201 A | * | 10/1993 | Atsumi et al. | 365/185.2 |
| 5,448,199 A | * | 9/1995 | Park | 327/546 |
| 5,493,234 A | * | 2/1996 | Oh | 326/33 |
| 5,598,122 A | * | 1/1997 | McClure | 327/530 |
| 5,757,211 A | | 5/1998 | Phillips | 327/73 |
| 5,811,993 A | * | 9/1998 | Dennard et al. | 327/54 |
| 5,994,950 A | * | 11/1999 | Ochi | 327/543 |
| 6,111,456 A | * | 8/2000 | Saito et al. | 327/541 |

* cited by examiner

*Primary Examiner*—Terry D. Cunningham
*Assistant Examiner*—Quan Tra
(74) *Attorney, Agent, or Firm*—Alan K. Stewart; W. James Brady, III; Frederick J. Telecky, Jr.

(57) ABSTRACT

A circuit is designed with a first transistor (661) having a current path coupled between a supply terminal (32) and a first output terminal (665). A second transistor has a current path coupled between the first output terminal and a reference terminal. The current path of the second transistor current path has substantially the same width and length as the first transistor current path. A first comparator circuit (679, 685) has first (668) and second (23) input terminals and a second output terminal (681). The first input terminal is coupled to the first output terminal. The first comparator circuit produces a control signal in response to a voltage between the first and second input terminals. A generator circuit (80) receives the control signal and produces an output voltage at the supply terminal.

6 Claims, 9 Drawing Sheets

US 6,624,685 B2

LEVEL DETECTION BY VOLTAGE ADDITION/SUBTRACTION

CLAIM TO PRIORITY OF PROVISIONAL APPLICATION

This application is a division of application Ser. No. 09/383,696, filed Aug. 26, 1999, which claims priority under 35 U.S.C. §119(e)(1) of provisional application No. 60/098,671, filed Sep. 1, 1998, the entirety of which is incorporated herein by reference.

FIELD OF THE INVENTION

This invention relates to an integrated circuit and more particularly to an integrated circuit with a voltage level detector using voltage addition or subtraction.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology continually reduce feature sizes and gate dielectric thickness. Internal operating voltages must be closely regulated for these reduced feature sizes and gate dielectric thickness in order to maintain reliability. Moreover, this regulation must be effective over a wide range of external voltage and temperature.

Regulation of internal voltage supplies, such as Vpp and Vbb, for SDRAM and FLASH memory circuits is particularly critical due to the relatively high electric field across the gate dielectric of memory cells during a memory operation. Large variations in voltage supplies Vpp or Vbb may degrade memory cell transistor performance characteristics over time and even lead to dielectric rupture and field failure of SDRAM memory cells. Large variations in voltage supply Vbb may degrade overall circuit performance through transistor threshold voltage variation due to body effect. Previous regulation attempts were based on detecting variation of voltage supplies Vpp and Vbb by an integral number of transistor threshold voltages with respect to supply voltage Vdd or reference voltage Vss. For example, the Vpp level detector circuit of FIG. 9A includes series connected reference transistors 901, 903 and 909 having channel width to length (W/L) ratios of 28/1, 2/5 and 2/5, respectively. These different ratios of reference transistors have a disadvantage of producing reference voltage errors due to transistor threshold voltage variations. The Vbb level detector circuit of FIG. 9B includes series connected P channel reference transistors 951, 953 and 955 and N-channel reference transistors 957 and 959. These reference transistors produce even greater reference voltage errors due to threshold voltage variation, conductivity type and body effect differences arising from different bulk-to-source voltages. These reference voltage errors produce significant variation in regulated levels of voltage supplies such as Vpp or Vbb. Thus, methods of the prior art failed to closely regulate the value of voltage supplies due to a wide variation of transistor threshold voltage with temperature and process parameter variations.

SUMMARY OF THE INVENTION

These problems are resolved by a circuit, comprising a first transistor having a current path coupled between a supply terminal and a first output terminal, the first transistor current path having a width and a length. A second transistor has a current path coupled between the first output terminal and a reference terminal and has substantially the same width and length as the first transistor current path. A first comparator circuit has first and second input terminals and a second output terminal. The first input terminal is coupled to the first output terminal. The first comparator circuit produces a control signal in response to a voltage between the first and second input terminals. A generator circuit is coupled to receive the control signal and produces an output voltage at the supply terminal.

The present invention linearly translates the supply voltage to a reference voltage without loss of accuracy due to transistor threshold voltage, temperature or supply voltage variation.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
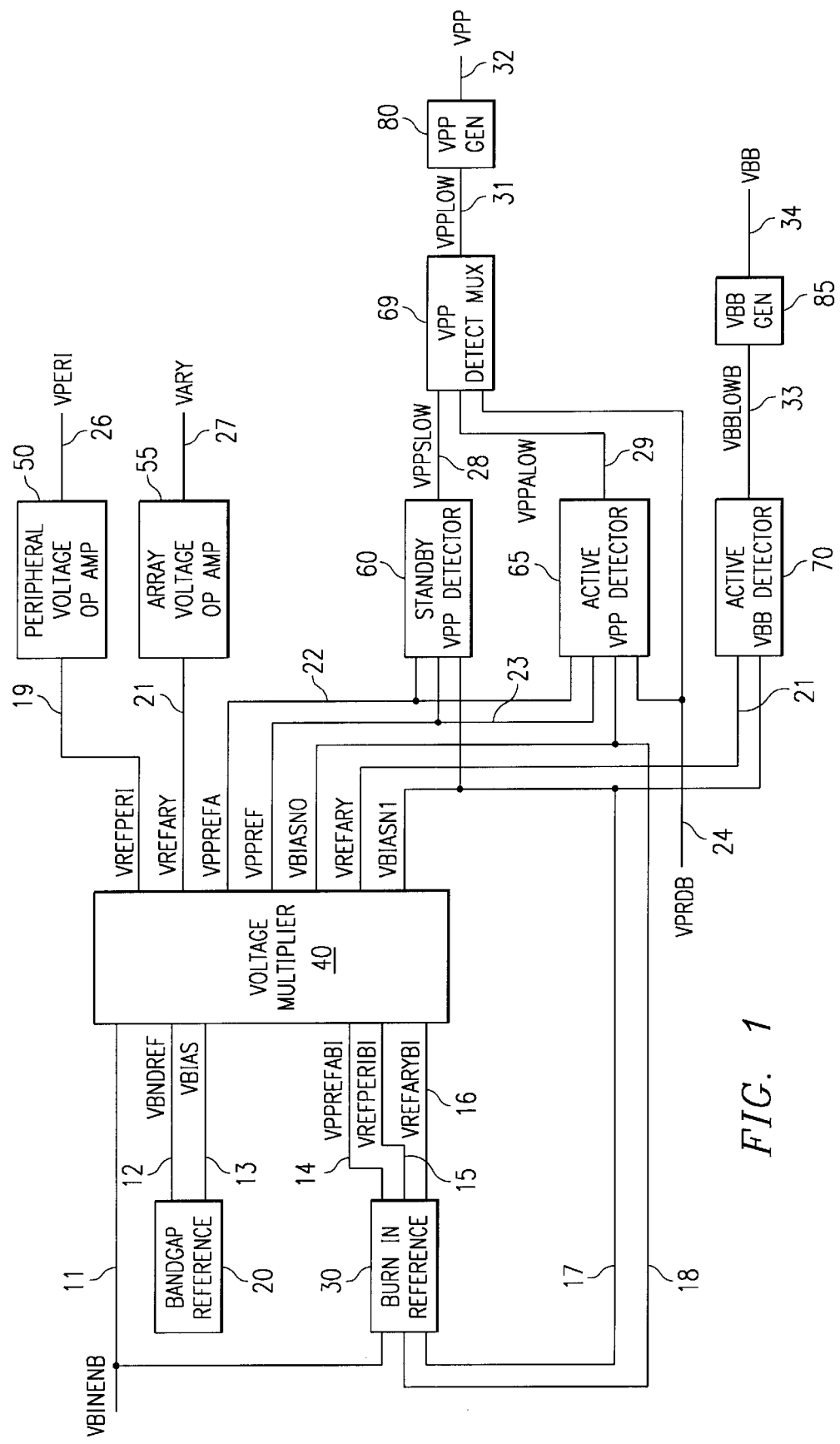
FIG. 1 is a block diagram of a regulator circuit which may employ a level detector of the present invention.

A regulator circuit which may employ the level detector of the present invention as shown in FIG. 1 will be described in detail. The regulator circuit includes a bandgap reference generator 20 to produce stable reference voltages VBNDREF and VBIAS based on physical properties of a PN junction of a bipolar transistor. A burn in reference circuit 30 produces another set of reference voltages for use during a high voltage burn in test of the semiconductor device. Voltage multiplier circuit 40 receives these reference voltages and produces a set of stable reference voltages for various voltage supply generators on the semiconductor device in response to burn in control signal VBINENB on lead 11. The peripheral voltage supply op amp 50, for example, produces regulated peripheral voltage supply VPERI on lead 26 in response to reference voltage VREFPERI on lead 19. Likewise, the array voltage supply op amp 55 produces regulated array voltage supply VARY on lead 27 in response to reference voltage VREFARY on lead 21. Standby 60 and active 65 Vpp detector circuits receive reference voltages VPPREFA and VPPREF for producing control signals VPPSLOW and VPPALOW, respectively. The Vpp detector multiplex circuit 69 passes the proper control signal to Vpp generator 80 as control signal VPPLOW on lead 31 in response to read control signal VPRDB on lead 24. Here, the Vpp generator 80 may be any of several charge pump designs comprising oscillator, diode and capacitor circuits for producing a high voltage supply for the semiconductor device as is well known to those of ordinary skill in the art. This Vpp generator circuit produces a regulated Vpp supply voltage on lead 32 in response to control signal VPPLOW. Finally, the Vbb or substrate voltage supply detector receives reference signal VREFARY on lead 21 and produces control signal VBBLOWB on lead 33. The Vbb generator circuit 85, which may also be any of several charge pump designs, then produces the regulated negative voltage supply Vbb on lead 34 in response to reference voltage VREFARY on lead 21.

Figure 2:
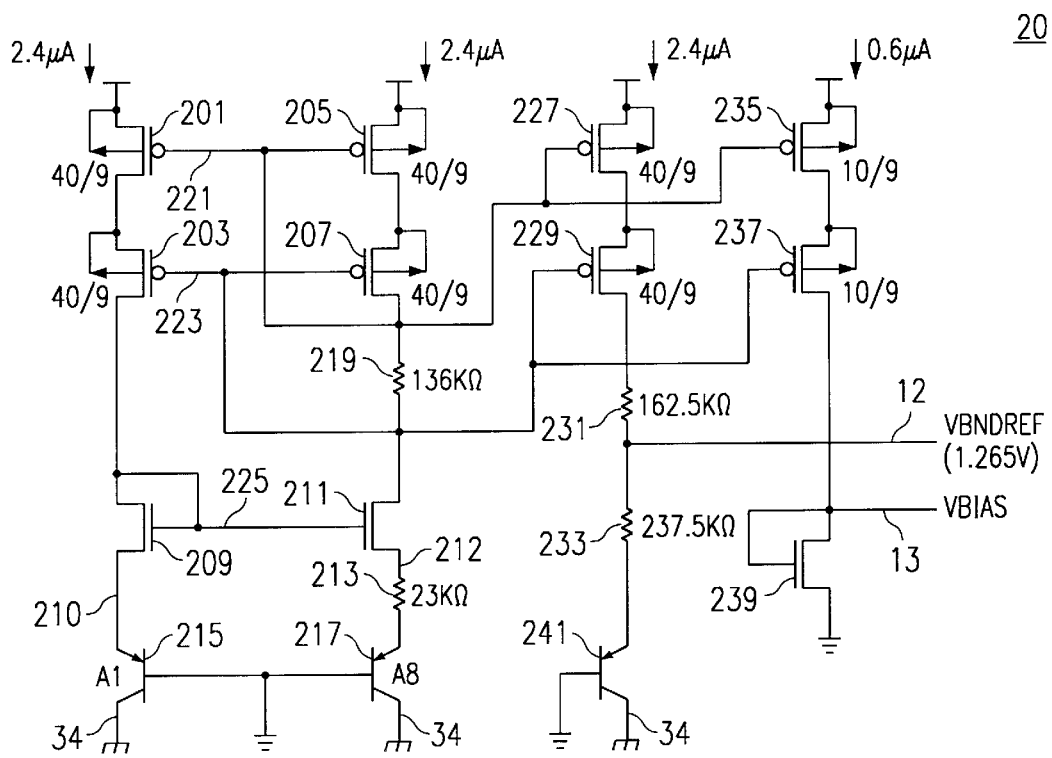
FIG. 2 is a schematic diagram of a bandgap reference circuit of the level detector circuit of the present invention.

Turning now to FIG. 2, operation of the bandgap reference generator circuit 20 will be explained in detail. The bandgap reference generator includes a first cascode current mirror circuit formed by P channel transistors 201, 205, 203 and 207. This first cascode mirror circuit is in series with a second current mirror circuit formed by N channel transistors 209 and 211. Both current mirrors are in series with a Widlar reference circuit formed by resistor 213 and bipolar transistors 215 and 217. Each series-connected transistor of a first set 201, 203, 209 and 215 corresponds in size, type and conductivity to a respective counterpart in the second set 205, 207, 211 and 217, thereby forming two parallel current paths. Each current path is designed so that the MOS transistors operate in saturation mode and conduct 2.4 μA of current. Bipolar transistors 215 and 217 have areas that are a multiple of 1 and 8, respectively. This greater area of transistor 217 produces a smaller Vbe than that of transistor 215. The difference in Vbe is equal to a voltage across resistor 213, thereby maintaining the same voltage at terminals 210 and 212. The bandgap voltage of the bipolar transistors 215 and 217 has a negative temperature coefficient while resistor 213 has a positive temperature coefficient. Thus, the current through each path remains at a relatively constant 2.4 μA over temperature variations of interest. Common P channel gate leads are connected to respective P channel transistors 227 and 229. These P channel transistors have the same W/L=40/9 as corresponding P channel transistors 201, 203 and 205, 207. The current through series-connected transistors 227 and 229 and bipolar transistor 241, therefore, is also 2.4 μA.

Moreover, the voltage Vbe (0.695 V) of bipolar transistor 241 in combination with the voltage developed across resistor 233 (237.5 KΩ* 2.4 μA=0.57 V) produces a stable reference signal VBNDREF of 1.265 V. A fourth current path including P channel transistors 235 and 237 is designed with W/L=10/9, thereby conducting 0.6 μA. An N channel transistor 239 is included in series with the current path to produce reference signal VBIAS at slightly more than an N channel transistor threshold voltage on lead 13.

Figure 3:
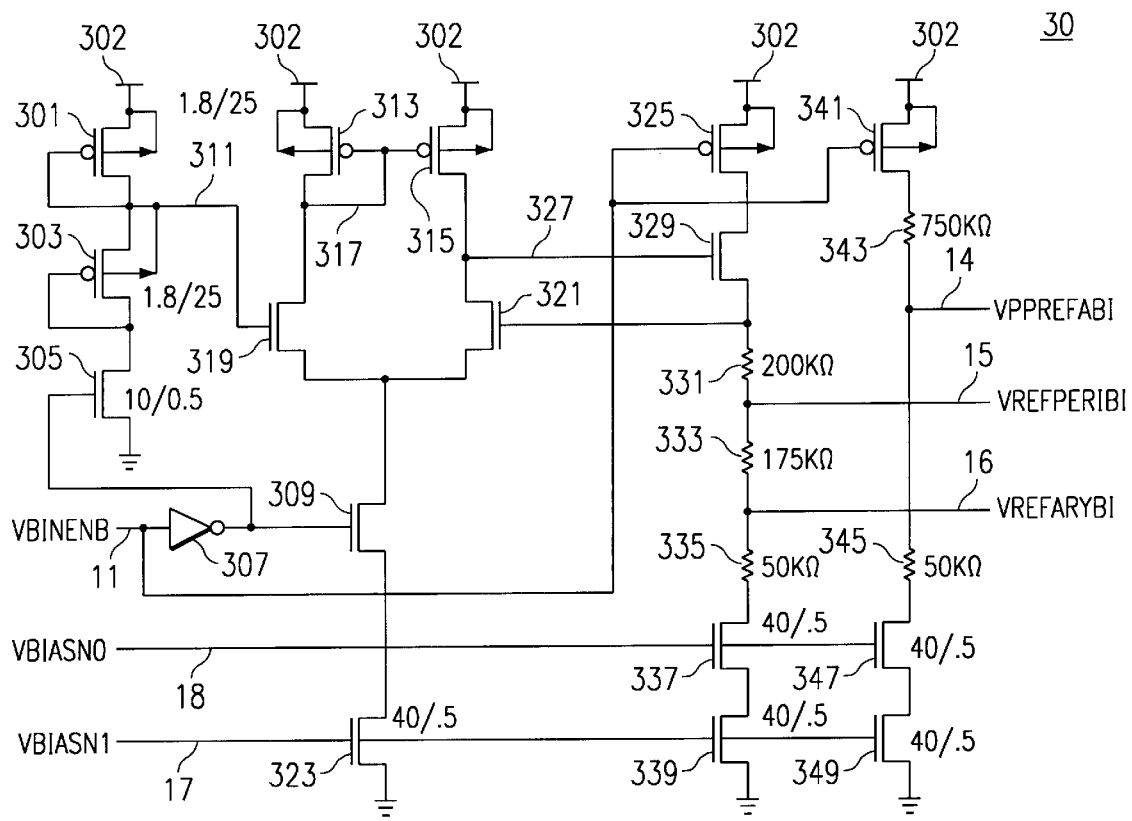
FIG. 3 is a schematic diagram of a burn in reference circuit of the level detector circuit of the present invention.

Turning now to FIG. 3, operation of a burn in reference circuit 30 will be explained in detail. A burn in test is initiated when a reference circuit (not shown) detects a high level of external voltage Vdd ext on lead 302 and produces active low burn in enable signal VBINENB on lead 11.

Inverter 307 produces a high output signal that turns on N channel transistors 305 and 309. Transistor 305 connects the common gate-drain terminal of transistor 303 to ground, thereby producing a voltage equal to half of external voltage Vdd ext on lead 311. This half Vdd ext level is applied to the control gate of input transistor 319 of a comparator which is activated by N channel transistor 309. The output of the comparator at lead 327 is applied to N channel feedback transistor 329, thereby producing the same half Vdd ext at the control gate of input transistor 321. A reference current through feedback transistor 329 is determined by N channel transistors 337 and 339 and their respective bias levels VBIASN0 and VBIASN1. The drain of N channel transistor 329 receives supply voltage Vdd ext through P channel transistor 325 which is also activated by signal VBINENB. Reference voltage VREFPERIBI, therefore, is equal to half Vdd ext minus a product of the reference current and 200 KΩ resistor 331. Likewise, reference voltage VREFARYBI is equal to half Vdd ext minus a product of the reference current and the 375 KΩ sum of resistors 331 and 333. Reference voltage VPPREFABI, however, is equal to Vdd ext minus a product of the reference current and 750 KΩ resistor 343. Thus, burn in reference voltages are produced with respect to Vdd ext. This is highly advantageous since it permits a memory tester to simultaneously control several internal voltage supplies during burn in by the application of Vdd ext.

Figure 4:
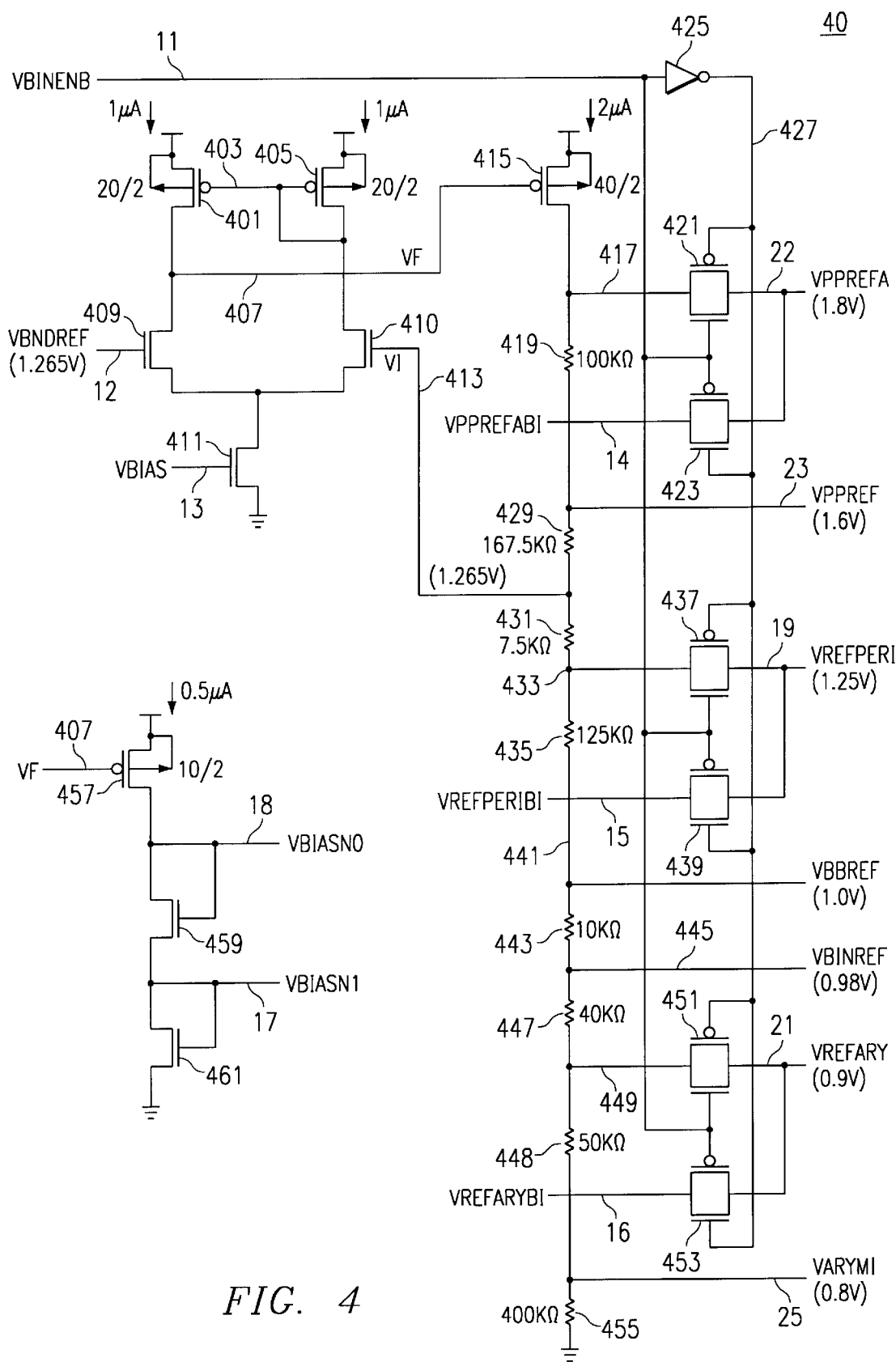
FIG. 4 is a schematic diagram of a voltage multiplier circuit of the level detector circuit of the present invention.

The voltage multiplier circuit 40 of FIG. 4 receives reference voltages produced by bandgap reference circuit 20 and burn in reference circuit 30. A comparator including current source transistors 401 and 405 and input transistors 409 and 410 is activated by reference voltage VBIAS at the control gate of N channel transistor 411. Each of the current source transistors is designed to conduct 1.0 μA. A first input transistor 409 receives reference voltage VBNDREF. This reference level is duplicated as level VI at the control gate of a second input transistor 410. An output terminal 407 of the comparator is coupled to gate of P channel transistor 415. The W/L of transistor 415 is twice that of either of transistors 401 or 405, thereby conducting a reference current of 2.0 μA. This reference current is further conducted through a resistive element including resistors 419, 429, 431, 435, 443, 447, 448 and 455. This resistive element may be preferably formed from a P+ doped region, an N+ doped region, a polycrystalline silicon region or other suitable resistive material. Multiple reference voltage levels are produced at respective output terminals along the length of the resistive element with respect to ground by multiplying a stable reference current with known resistance values. For example, the voltage level at output terminal 449 of the resistive element is equal to a product of the 2.0 μA reference current and the 450 KΩ sum of resistors 448 and 455 or 0.9 V. This is highly advantageous, since it provides stable internal reference voltages with respect to ground for normal circuit operation independent of the noise on external voltage Vdd ext of the memory system.

Control signal VBINENB is high during normal circuit operation. This high level and the resulting low level on lead 427 turn on CMOS pass gates 421, 437 and 451, thereby producing reference voltages on leads 417, 433 and 449 at leads 22, 19 and 21, respectively. Alternatively, when control signal VBINENB is low during a burn in test, CMOS pass gates 421, 437 and 451 are off and CMOS pass gates 423, 439 and 453 are on, thereby applying burn in reference voltages VPPREFABI, VREFPERIBI and VREFARYBI to leads 22, 19 and 21, respectively.

Figure 5:
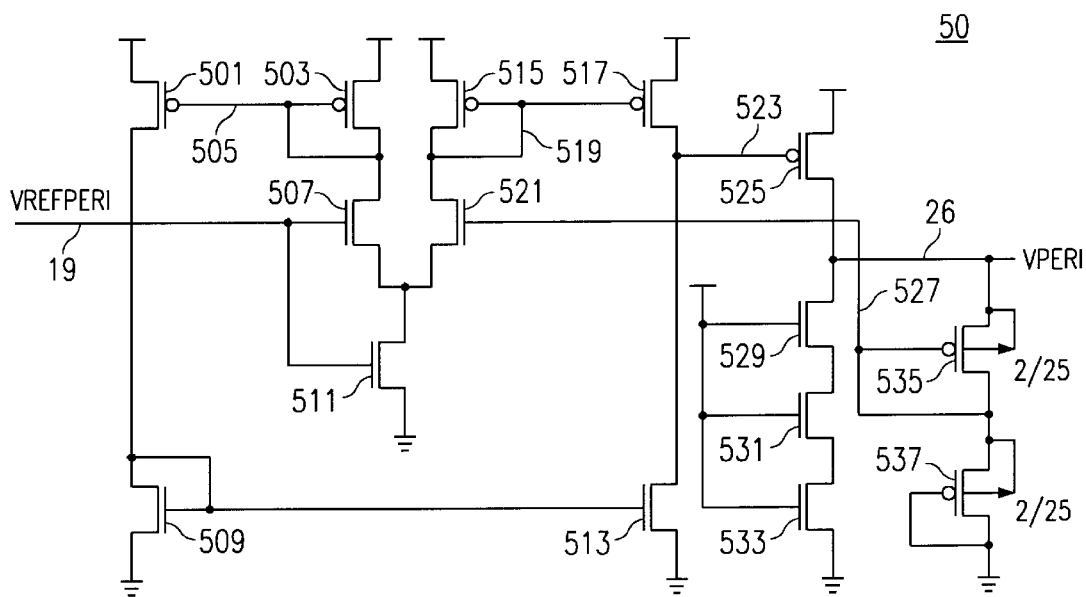
FIG. 5 is a schematic diagram of a supply voltage op amp circuit of the level detector circuit of the present invention.

Turning now to FIG. 5, operation of a supply voltage op amp circuit 50 will be explained in detail. Supply voltage VARY op amp circuit 55 is the same as VPERI supply voltage op amp circuit 50. The op amp circuit 50 includes a comparator circuit with current source transistors 503 and 515 and input transistors 507 and 521 and a buffer circuit with transistors 501, 517, 509 and 513. An output terminal 523 of the buffer circuit is connected to the control gate of P channel drive transistor 525 for producing supply voltage VPERI at lead 26. In normal operation, input transistor 507 receives reference voltage VREFPERI on lead 19, having a value of 1.25 V. This reference voltage is duplicated at the control gate of input transistor 521 through the feedback path provided by drive transistor 525 and the supply reference circuit. This supply reference circuit forms a voltage divider with P channel transistors 535 and 537 having the same W/L=2/25. Thus, the value of supply voltage VPERI is twice the voltage on lead 527 or 2.5 V. This supply voltage op amp circuit, therefore, has a gain of 2. This is highly advantageous, because it permits scaled regulation of a supply voltage with a stable reference voltage having a lower magnitude. This lower magnitude permits regulation over a wide range of external voltage Vdd ext even with the inherent loss of threshold voltages across P channel transistors 503 and 515 and N channel transistor 511.

Figure 6A:
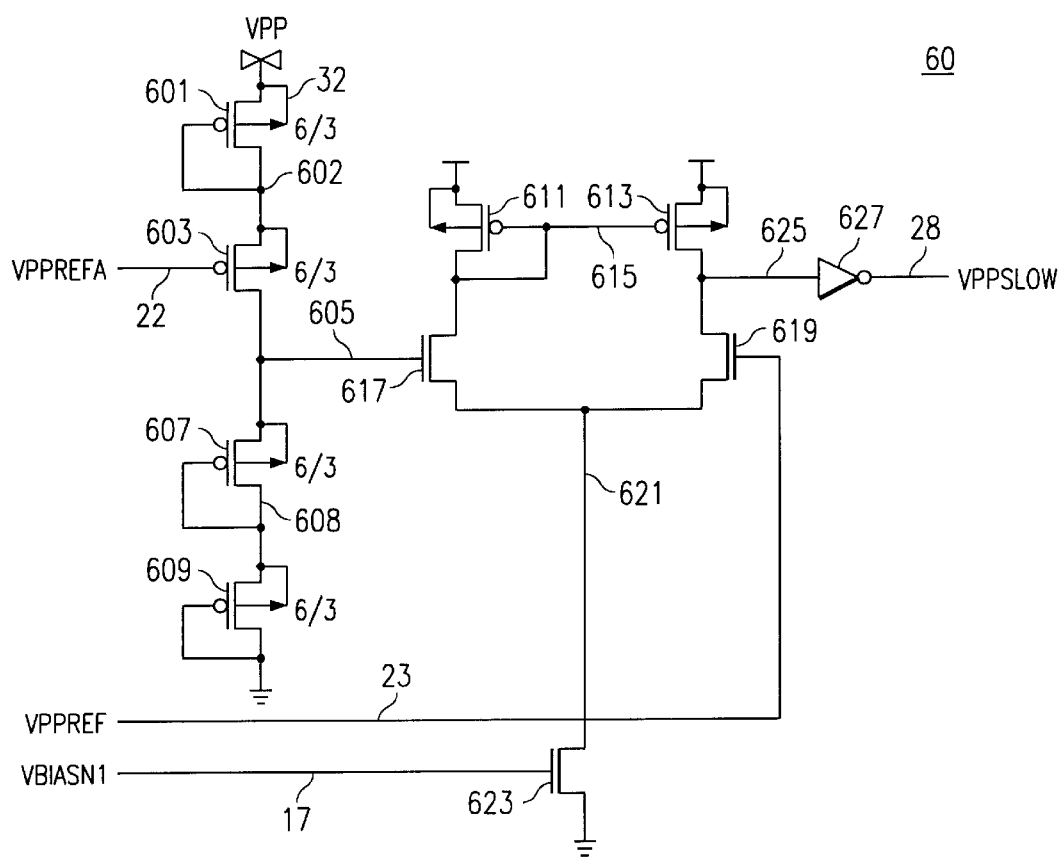
FIG. 6A is a schematic diagram of a standby Vpp level detector circuit of the instant invention with voltage subtraction.

The schematic diagram of FIG. 6A depicts a standby Vpp level detector circuit of the instant invention with voltage subtraction. A reference circuit including series-connected P channel transistors 601, 603, 607 and 609 receives reference voltage VPPREFA on lead 22 and produces an output reference voltage on lead 605 by linear voltage subtraction. This linear voltage subtraction is independent of transistor threshold voltage variation and body effect, because all transistors are the same size and the bulk terminal of each transistor is directly connected to its source. For example, transistor threshold voltage is:

$$V\text{th} = Vt0 + BE[(Vbs + 2\psi f)^{1/2} - (2\psi f)^{1/2}]$$

where the Fermi potential is $$\psi f = KT\, ln(Na/ni)/q$$

the body effect parameter is $$BE = t_{ox}/\epsilon_{ox}(2q\epsilon_{si}Na)$$

and Vbs is bulk-substrate voltage of the P-channel transistor. When the bulk terminal is directly connected to its source, however, Vth is equal to Vt0. The current through each transistor in the reference circuit in saturation mode is:

$$Ids = K'W/L(Vgs - V\text{th})^2$$

and equating drain currents for each transistor of the reference circuit produces the following three equations.

$$K'W/L(V602 - Vpp - V\text{th})^2 = K'W/L(\text{VPPREFA} - V602 - V\text{th})^2$$

$$K'W/L(\text{VPPREFA} - V602 - V\text{th})^2 = K'W/L(V608 - V605 - V\text{th})^2$$

$$K'W/L(V608 - V605 - V\text{th})^2 = K'W/L(0 - V608 - V\text{th})^2$$

Eliminating K' W/L, taking the square root of each equation and eliminating Vth produces the following simplified equations.

$$V602Vpp = \text{VPPREFA} - V602$$

$$\text{VPPREFA} - V602 = V608 - V605$$

$$V608 - V605 = -V608$$

The solution to these equations shows that the reference voltage at lead 605 (V605) is equal to Vpp minus VPPREFA. Since the design target of the reference circuit is a voltage of 1.6 V (VPPREF) at lead 605 that follows Vpp variations, and Vpp is equal to 3.4 V, reference voltage VPPREFA is set to 1.8 V. Thus, the level of the reference voltage at lead 605 is:

$$V605 = Vpp - \text{VPPREFA} = 3.4\,V - 1.8\,V = 1.6\,V$$

The reference circuit output 605 is connected to the control gate of a first input transistor 617 of a comparator. Reference voltage VPPREF is applied to the control gate of the other input transistor 619. The comparator produces a control signal at terminal 625 that is buffered by inverter 627 to produce control signal VPPSLOW on lead 28. This control signal VPPSLOW is normally low and goes high when the reference voltage on lead 605 indicates supply voltage Vpp is below a desired level.

Figure 6B:
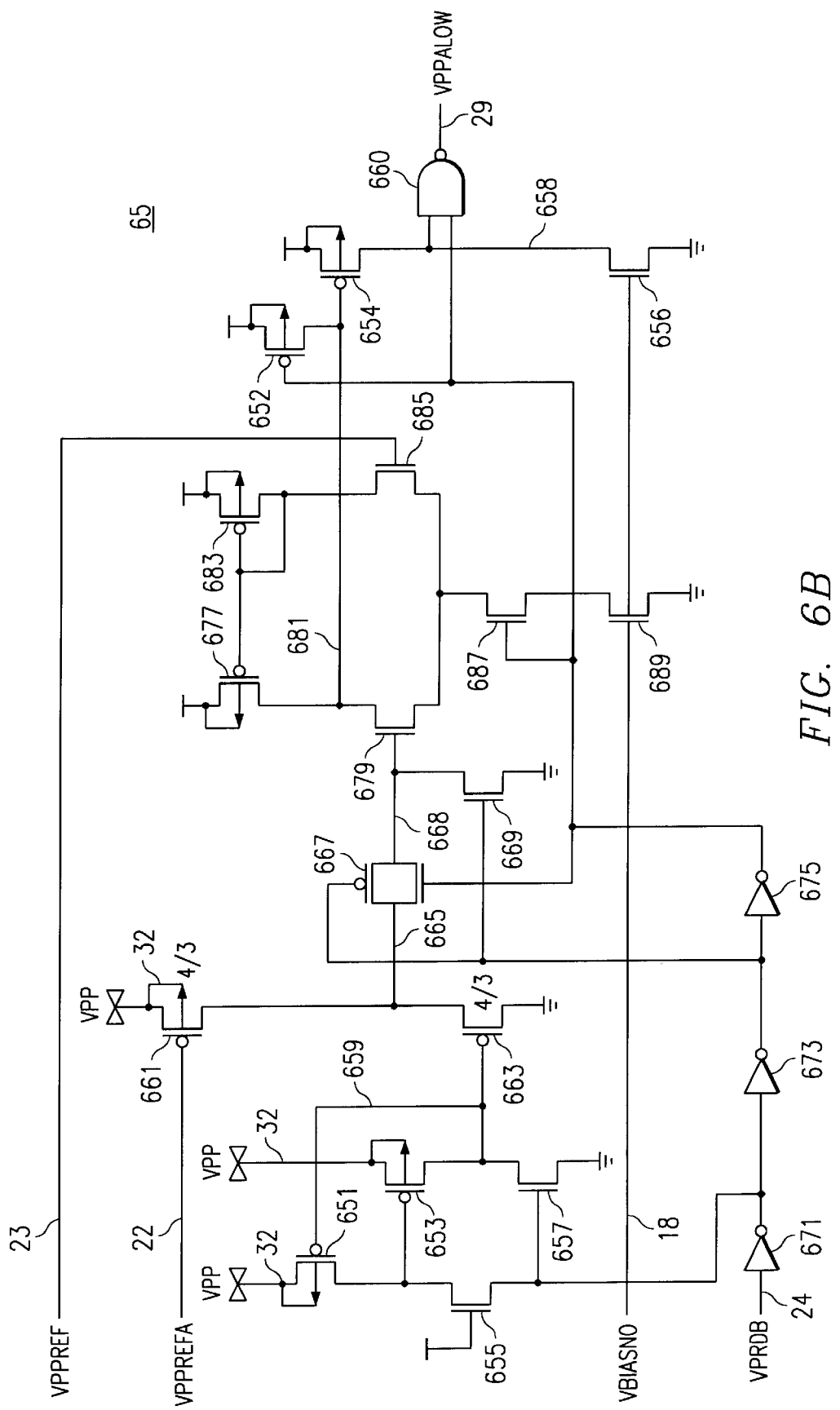
FIG. 6B is a schematic diagram of an active Vpp level detector circuit of the instant invention with voltage subtraction.

Turning now to FIG. 6B, an active Vpp level detector circuit will now be described in detail. The level detector circuit receives a low level control signal VPRDB on lead 24 to indicate active mode operation. Inverter 671 produces a high level signal to turn on N channel transistor 657 of a level translator further including transistors 651, 653 and 655. N channel transistor 657 connects the control gate of transistor 663 to ground. Thus, transistors 661 and 663 form a two-transistor voltage subtraction circuit similar to the previously described reference circuit of the standby level detector. Likewise, the reference voltage on lead 665 is equal to Vpp minus VPPREFA. In the active mode, Inverters 673 and 675 produce low and high output signals, respectively, to activate CMOS pass gate 667, thereby applying the reference voltage on lead 665 to the control gate of input transistor 679. This reference voltage is compared to VPPREF at the control gate of input transistor 685, thereby producing a control signal on output lead 681. This control signal is buffered by P channel transistor 654 and inverted by NAND gate 660 to produce control signal VPPALOW on lead 29. This control signal is normally low and goes high when Vpp is below a desired level.

Figure 8A:
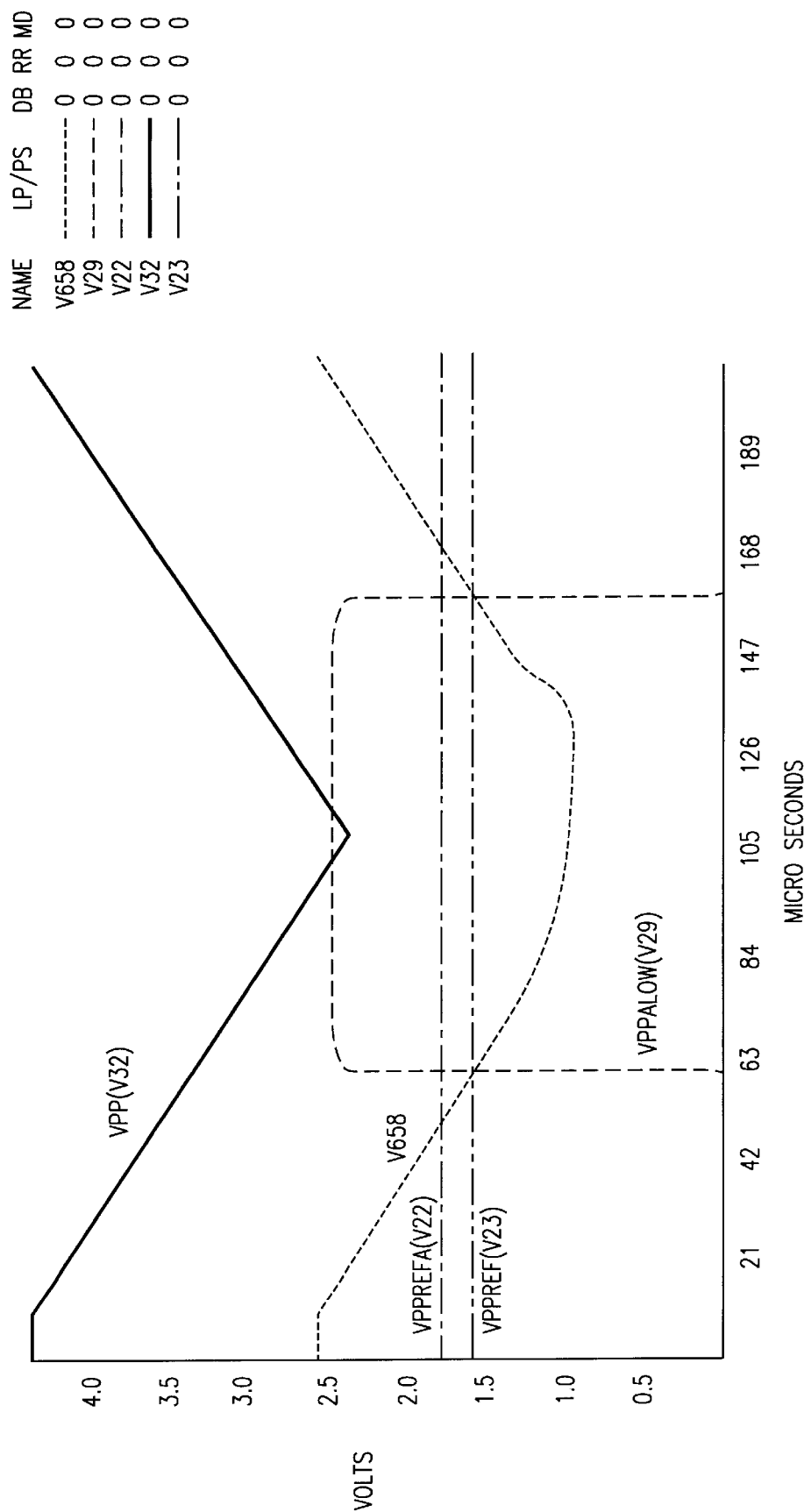
FIG. 8A is a simulation diagram of the Vpp level detector circuit of FIG. 6B.

Simulation waveforms of FIG. 8A illustrate operation of the Vpp level detector circuit for Vpp variation between 2.4 V and 4.4 V. Control signal VPPLOW is initially low as supply voltage Vpp is decreased. When Vpp is less than 3.4 V, the lead 658 is driven low producing a high control signal VPPALOW on lead 29 for activating Vpp generator 80. Likewise, as supply voltage Vpp becomes more positive and reaches the target level of 3.4 V, control signal VPPLOW is driven low to disable Vpp generator 80. Thus, the Vpp level detector accurately regulates the Vpp supply voltage level through linear voltage subtraction independent of transistor threshold voltage variation.

In standby mode, control signal VPRDB goes high, and the low-level output of inverter 671 turns off transistor 657 and turns on transistor 655. This produces a high level output from the level translator on lead 659, thereby turning off transistor 663. Output signals from inverters 673 and 675 turn off CMOS pass gate 667 and transistor 687 and turn on transistor 669 and 652. This disables the comparator and produces a high-level control signal VPPALOW on lead 29.

Figure 6C:
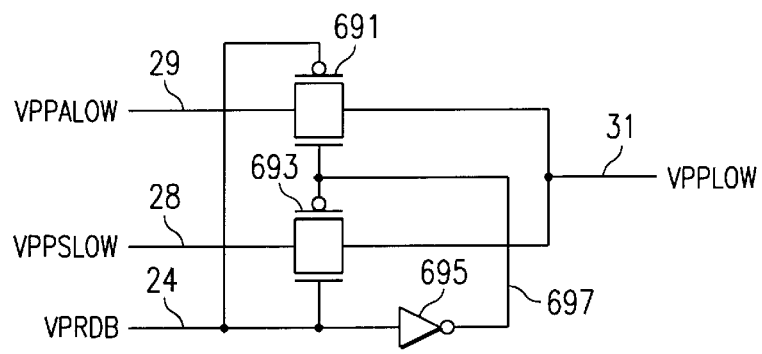
FIG. 6C is a schematic diagram of a multiplex circuit of the level detector circuit of the instant invention.

The multiplex circuit 69 of FIG. 6C receives a low level control signal VPRDB on lead 24 for selecting the active Vpp level detector signal VPPALOW by turning on CMOS pass gate 691. Alternatively, the multiplex receives a high-level control signal VPRDB for selecting the standby Vpp level detector signal VPPSLOW by turning on CMOS pass gate 693. The selected level detector signal is then applied to lead 31 to produce control signal VPPLOW. This control signal is then applied to Vpp generator circuit 80 (FIG. 1) to produce supply voltage Vpp on lead 32.

Figure 7:
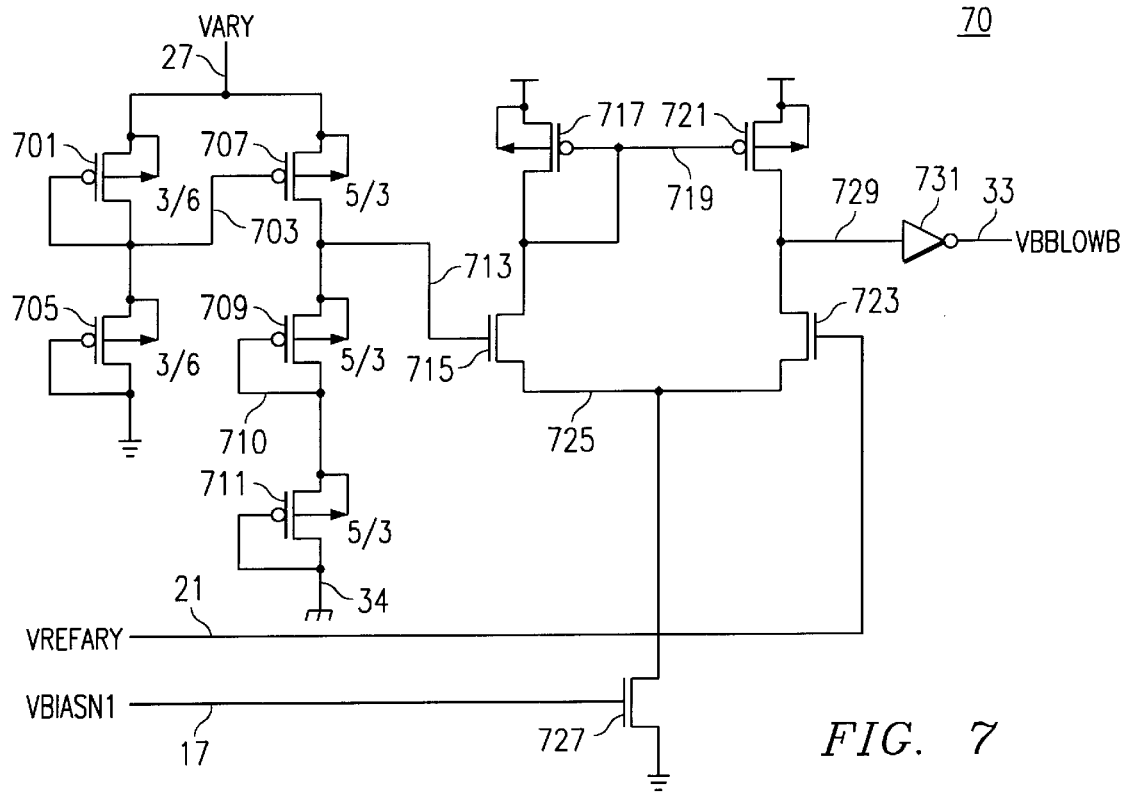
FIG. 7 is a schematic diagram of a Vbb level detector circuit of the instant invention with voltage addition.

Turning now to FIG. 7, there is a schematic diagram of a Vbb level detector circuit of the instant invention using voltage addition. A first reference circuit including transistors 701 and 705 produces a reference voltage equal to half the VARY voltage at lead 703. This reference level is applied to the control gate of transistor 707 of a second reference circuit including transistors 707, 709 and 711. An analysis of this second reference circuit similar to the one previously described shows that the reference voltage at output lead 713 is equal to the sum of Vbb and twice the difference between voltage VARY and the voltage on lead 703 or 2 (1.8 V–0.9 V)–0.9 V=0.9 V. This reference voltage is compared to reference voltage VREFARY on lead 21 to produce an output signal on lead 729. This output signal is inverted to produce control signal VBBLOWB on lead 33, which is applied to Vbb generator 85 (FIG. 1) to produce supply voltage Vbb on lead 34.

Figure 8B:
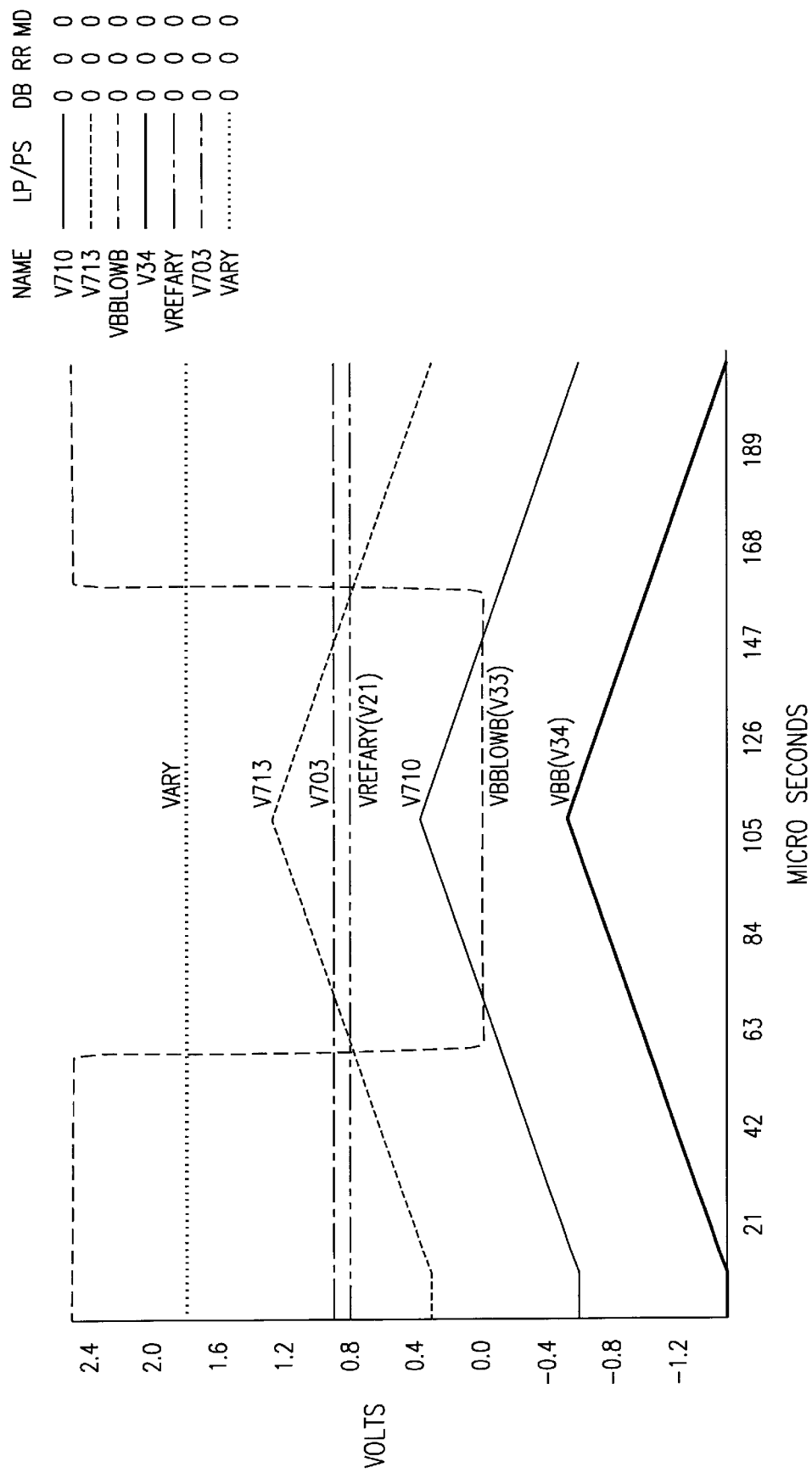
FIG. 8B is a simulation diagram of the Vbb level detector circuit of FIG. 7.
Figure 9A:
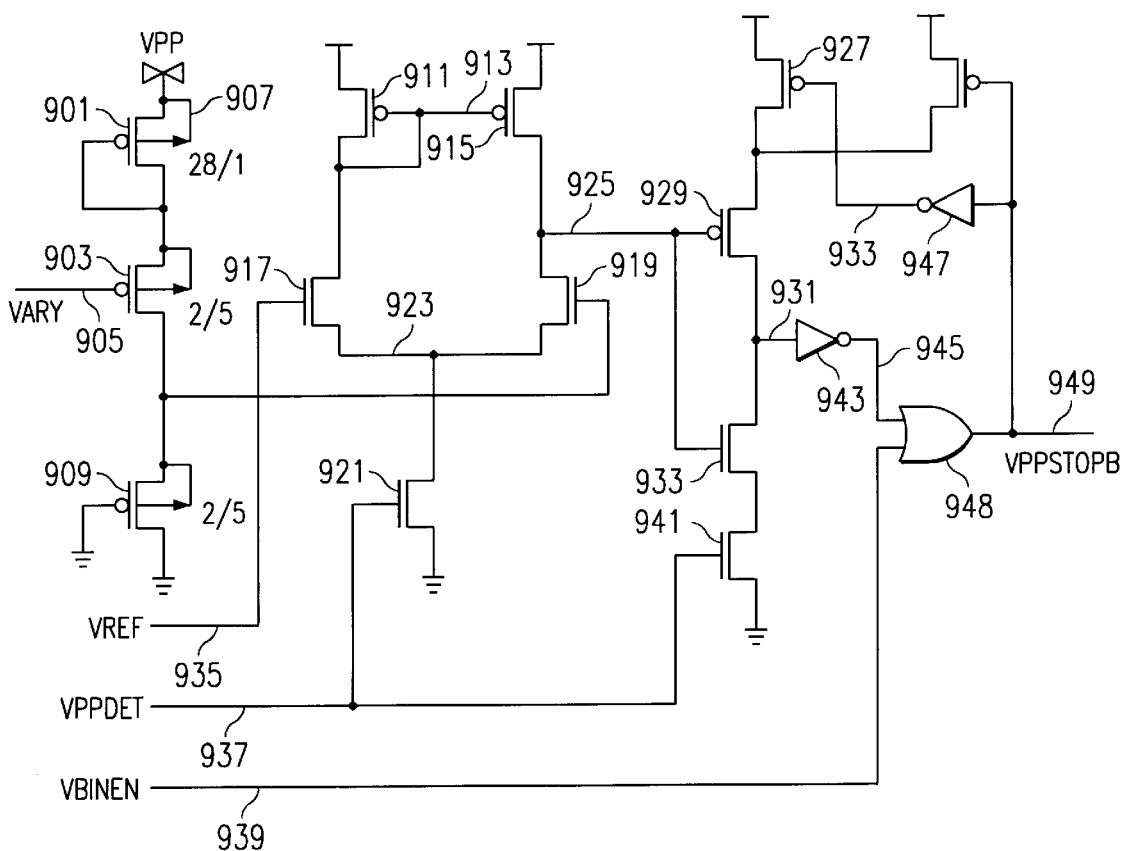
FIG. 9A is a schematic diagram of a Vpp level detector circuit of the prior art.
Figure 9B:
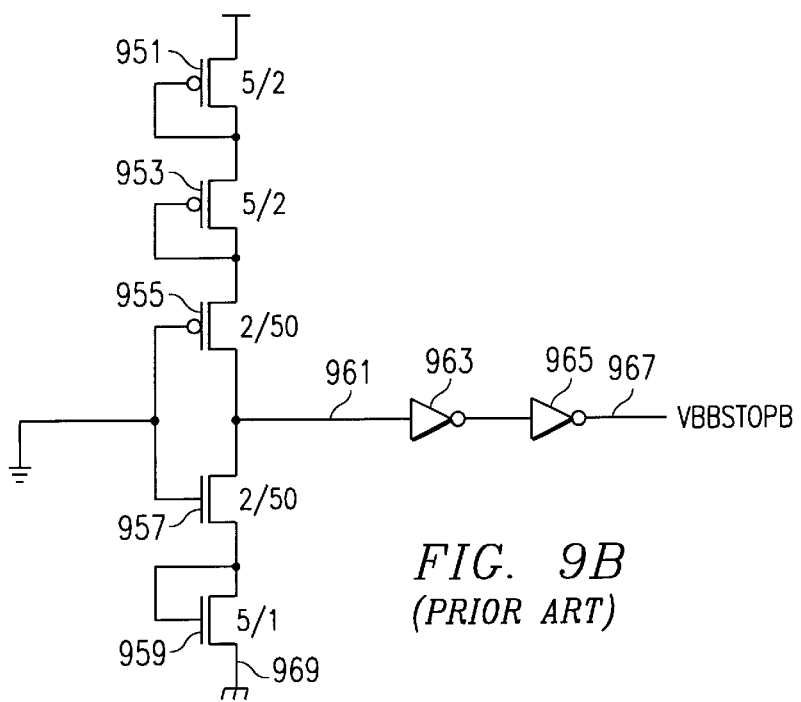
FIG. 9B is a schematic diagram of a Vbb level detector circuit of the prior art.

Simulation waveforms of FIG. 8B illustrate operation of the Vbb level detector circuit for Vbb variation between –0.6 V and –1.4 V. Control signal VBBLOWB is initially high as supply voltage Vbb is increased. When Vbb becomes more positive than –0.9 V, the reference voltage on lead 713 becomes more positive than reference voltage VREFARY on lead 21. This positive difference voltage drives control signal VBBLOWB low for activating Vbb generator 85. Likewise, as supply voltage Vbb becomes more negative and reaches the target level of –0.9 V, control signal VBBLOWB is driven high to disable Vbb generator 85. Thus, the Vbb level detector accurately regulates the Vbb supply voltage level through linear voltage addition independent of transistor threshold voltage variation.

This circuit offers significant advantages over reference circuits of the prior art. First, it does not depend on a discrete number of transistor threshold voltages for voltage detection. Stable reference voltages derived from a bandgap reference generator circuit and a voltage multiplier circuit regulate the voltage supplies. Second, the voltage comparator circuits derive reference voltages from actual supply voltages through linear voltage translation. Comparator circuits need not compare actual supply voltages to target reference voltages and are capable, therefore, of operating at very low external supply voltage levels. Third, the method of linear voltage translation is independent of variation of transistor threshold voltage due to body effect. Finally, this method of detection is approximately linear over the supply voltage range of interest.

Although the invention has been described in detail with reference to its preferred embodiment, it is to be understood that this description is by way of example only and is not to be construed in a limiting sense. For example, the bandgap reference circuit of FIG. 2 might be modified for very low voltage operation by including only two P channel transistors in series with bipolar transistors 215 and 217. Control gates of these P channel transistors would be connected to the output of a comparator that had input terminals connected to leads 210 and 212, respectively. This would maintain advantages of the bandgap reference circuit without threshold voltage losses due to the current mirrors. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:

a first transistor having a current path coupled between a supply terminal and a first output terminal, the first transistor current path having a width and a length;

a second transistor having a current path coupled between the first output terminal and a reference terminal, the second transistor current path having a width and a length;

a comparator circuit having first and second input terminals and having a second output terminal, the first input terminal coupled to the first output terminal, wherein the comparator circuit is enabled in response to a first logic state of a control signal and disabled in response to a second logic stale of the control signal;

a first load transistor having a current path coupled to the comparator circuit and having a control gate coupled to receive a control voltage;

a feedback transistor having a control gate coupled to the second output terminal and having a current path coupled to the second input terminal;

a plurality of resistors connected in series to a reference voltage terminal between the current path of the feedback transistor and the reference terminal; and a second load transistor having a current path coupled between the plurality of resistors and the reference terminal, wherein a reference voltage at the reference voltage terminal is equal to a difference between a voltage at the first output terminal and a voltage that is a product of a current through the load transistor and a resistance of at least one resistor of the plurality of resistors.

2. A circuit as in claim 1, wherein the feedback transistor is an N-channel transistor.

3. A circuit as in claim 1, wherein the current path of each of the first and second transistors is enabled by the first logic state of the control signal.

4. A circuit as in claim 1, wherein the width and length of the first transistor are substantially the same as the width and length of the second transistor.

5. A circuit as in claim 1, wherein current flow through each of the first and second load transistors is terminated in response to the second logic state of the control signal.

6. A circuit as in claim 1, wherein current flow through each of the first and second transistors and through the first load transistor is terminated in response to the second logic state of the control signal.

* * * * *